United States Patent
Esch, Jr. et al.

(10) Patent No.: US 7,010,641 B2
(45) Date of Patent: Mar. 7, 2006

(54) INTEGRATED CIRCUIT ROUTING RESOURCE OPTIMIZATION ALGORITHM FOR RANDOM PORT ORDERING

(75) Inventors: Gerald L Esch, Jr., Ft. Collins, CO (US); Richard S. Rodgers, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 239 days.

(21) Appl. No.: 10/355,775

(22) Filed: Jan. 31, 2003

(65) Prior Publication Data

US 2004/0177209 A1 Sep. 9, 2004

(51) Int. Cl.
*G06F 13/00* (2006.01)
*G06F 13/42* (2006.01)
*G06F 17/00* (2006.01)

(52) U.S. Cl. .......................................... 710/316; 716/12
(58) Field of Classification Search ................. 710/316, 710/268, 3, 38; 361/803, 679, 686; 716/12–14; 326/38; 379/165; 370/419, 351; 712/33
See application file for complete search history.

(56) References Cited

U.S. PATENT DOCUMENTS

| | | | | |
|---|---|---|---|---|
| 5,317,631 A | * | 5/1994 | Chen | 379/164 |
| 5,426,738 A | * | 6/1995 | Hsieh et al. | 326/38 |
| 6,389,498 B1 | * | 5/2002 | Edwards et al. | 710/268 |
| 6,430,734 B1 | * | 8/2002 | Zahar | 716/12 |
| 6,665,737 B1 | * | 12/2003 | Edwards | 710/3 |
| 6,687,892 B1 | * | 2/2004 | Zahar | 716/12 |

OTHER PUBLICATIONS

"Improvd multicast switch architecture for optical cable television and video surveillance networks" by Kariniemi, H.; Numi, J. (abstract only) Publication Date: May 23–26, 2004.*

* cited by examiner

*Primary Examiner*—Gopal C. Ray

(57) ABSTRACT

A method of routing an integrated circuit signal bus is provided. One of a set of blocks having ports that are to be connected to the signal bus is selected as a primary block, the ports of which are positioned so that no two ports of that block lie within the same routing track parallel to the closest portion of a primary bus route. All other blocks, termed secondary blocks, have ports that are positioned so that no two ports of any secondary block reside within the same routing track perpendicular to the closest portion of the primary bus route. A primary connection for each signal of the signal bus is then placed over each port of the primary block substantially along the length of the primary route. Each port of each secondary block then has a secondary track connecting it in a perpendicular fashion to the proper primary track.

9 Claims, 6 Drawing Sheets

INTEGRATED CIRCUIT ROUTING RESOURCE OPTIMIZATION ALGORITHM FOR RANDOM PORT ORDERING

BACKGROUND OF THE INVENTION

As integrated circuit (IC) technology continues to evolve, the use within ICs of wide multi-signal buses, such as data buses, becomes more prevalent. Generally speaking, such buses consume large amounts of limited routing resources, causing routing problems for both the bus and other signal connections within an IC. Also, as the functional capacity of ICs increase, the interconnections required between circuit "blocks" of the IC increase as well, thus exacerbating the routing problem.

FIG. 1 exemplifies this problem by way of a simplified diagram. Three circuit blocks 2a, 2b and 2c are each connected to a signal bus comprised of signals 0 through n. Each block thus contains n+1 separate ports P, each of which is to be connected to the corresponding signal of the signal bus. Unfortunately, as is often the case, the ports P of each block 2 do not align with each other, but are instead ordered somewhat randomly within each block 2. As a result, each signal connection 1 requires the use of several vertical and horizontal routing resources, called "tracks," to implement the necessary connections. As more vertical and horizontal tracks are used, more routing resources are consumed, resulting in fewer routing options for other IC signals. In many cases, routing of such buses often causes enough congestion within the tracks to make routing of the entire IC problematic.

To help alleviate such routing congestion, IC designers sometimes force the placement of the ports within each block in an orderly fashion. An example of this port placement is shown in FIG. 2. Blocks 3a, 3b and 3c each employ ports P which are placed in order from signal 0 through signal n. As a result, each signal connection 1 requires the use of a single vertical routing track and no horizontal routing tracks, thus consuming substantially fewer routing resources than what were required with the random port ordering of FIG. 1.

However, such orderly port placement within each block often creates a burden on the IC designer in terms of time and effort to architect each block to minimize routing resources. Additionally, many block designs simply preclude such orderly port alignment.

From the foregoing, a need exists for the ability to optimize the routing of IC inter-block signals among blocks utilizing somewhat randomly placed ports. Such ability would reduce the substantial amount of routing resources typically required for signal buses while eliminating the burden of orderly port placement on the IC designer.

SUMMARY OF THE INVENTION

Embodiments of the invention, to be discussed in detail below, provide a method for routing an IC signal bus efficiently while minimizing the routing resources consumed. One of a set of blocks to be connected to the bus is selected as a primary block, the ports of which are to be positioned so that no two ports of the primary block reside within the same routing track running parallel to a primary bus route. All other blocks, known as secondary blocks, have ports positioned so that no two ports of each separate block reside within the same routing track running perpendicular to the primary bus route. A primary connection for each signal of the bus is then aligned over each primary block port, extending essentially along the length of the primary bus route. Each secondary block port then has a secondary connection associated with it that connects that port to the primary connection associated with that port in a perpendicular manner.

Other aspects and advantages of the invention will become apparent from the following detailed description, taken in conjunction with the accompanying drawings, illustrating by way of example the principles of the invention.

DETAILED DESCRIPTION OF THE PREFERRED EMBODIMENTS

Figure 3:
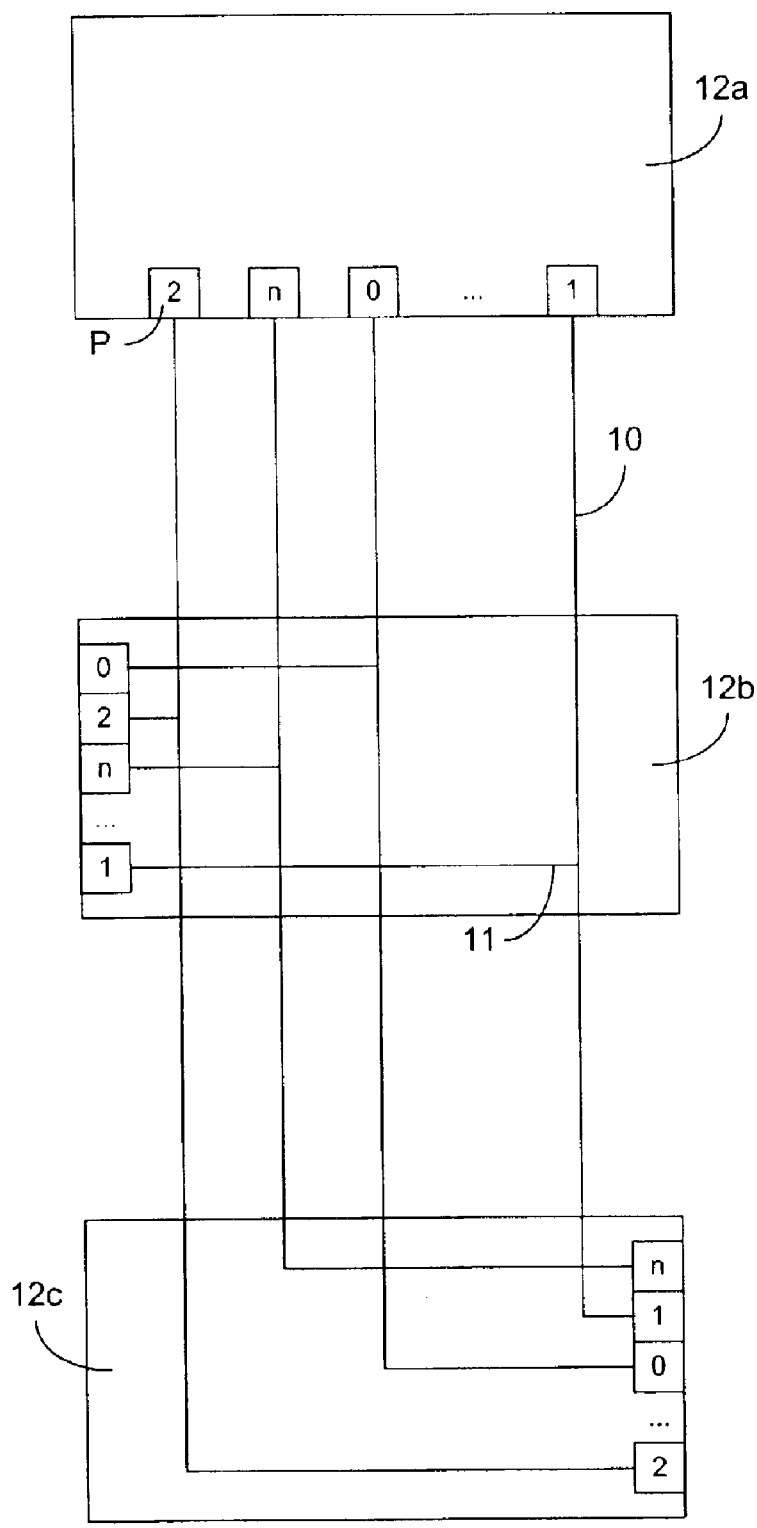
FIG. 3 is a diagram of an IC bus signal connection scheme according to an embodiment of the invention, wherein the circuit blocks and primary bus route are aligned vertically.
Figure 6:
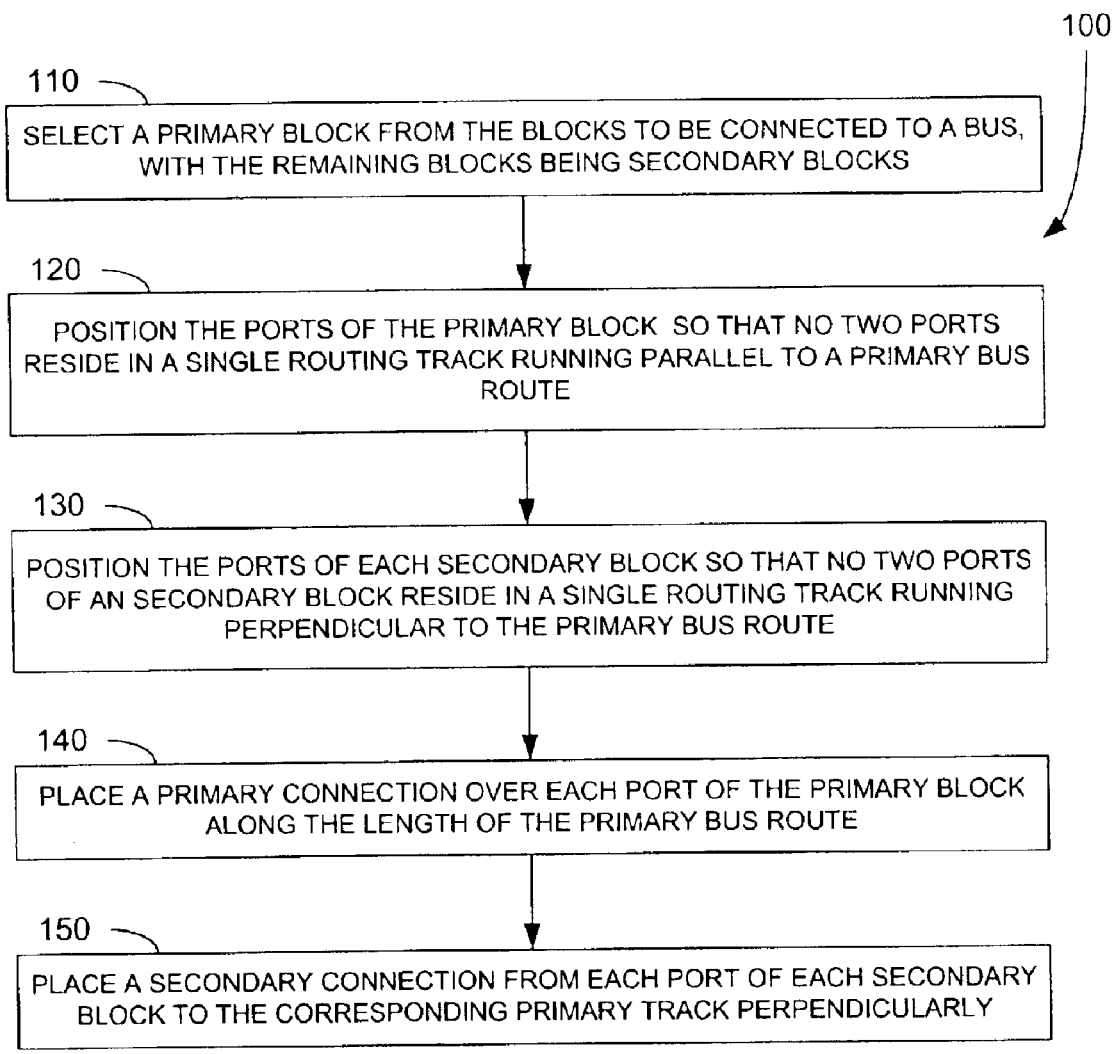
FIG. 6 is a flow diagram of a method for routing an IC signal bus according to an embodiment of the invention.

A simplified embodiment of the invention is shown in FIG. 3, using the method 100 for routing an IC signal bus, as shown in FIG. 6. Three circuit blocks 12a, 12b and 12c of an IC are aligned vertically. Ports P, numbered 0 through n, of each block are to be connected by way of a signal bus. In order to promote efficient utilization of the routing resources of the IC while allowing a measure of design freedom in the location of the ports P of each block 12, one of the circuit blocks 12 is selected as a primary block (step 110 of FIG. 6). In the specific example of FIG. 3, circuit block 12a is designated as the primary block, with the remaining blocks 12b and 12c thus being defined as secondary blocks.

The ports of the primary block are then positioned so that no two of those ports reside in the same routing track running parallel to a primary bus route (step 120 of FIG. 6). With respect to FIG. 3, the primary block 12a has ports P aligned along the bottom edge of the block. This alignment allows a primary bus route which runs substantially vertically over each of the blocks 12. Thus, the port alignment of the primary block 12a ensures that the bus connection to each of these ports P will occupy a separate vertical routing track within that primary bus route. In alternate embodiments, as applied to different block configurations, the primary bus route may run near some of the blocks without actually passing directly over them.

In alternate embodiments, the ports of the primary block will not strictly form a straight line; each port of the primary block need only reside within a separate routing track parallel to the primary bus route. However, in the case of FIG. 3, horizontal alignment of the ports P along the edge of the primary block 12a nearest the secondary blocks 12b and 12c retains the advantages of maintaining the shortest routing path among the circuit blocks 12, as well as freeing up additional vertical routing resources over the remainder of the primary block 12a for other circuit connections.

Ports for each of the secondary blocks are then positioned so that no two ports within a single secondary block reside in a single routing track perpendicular to the primary bus route (step 130 of FIG. 6). As shown in FIG. 3, the secondary blocks 12b and 12c each have ports P aligned along one of the vertical edges of the block. Such an alignment allows the connection of each port P to the signal bus by way of a distinct horizontal routing track. In other possible embodiments, the ports of each secondary block will not necessarily form a straight line; all that is needed is for each port of each secondary block to reside in a separate routing track perpendicular to the primary bus route.

Once the ports are positioned, a primary connection is placed over each port of the primary block substantially along the length of and parallel to the primary bus route (step 140 of FIG. 6). Referring to FIG. 3, a set of primary connections 10 provides connection to the ports P of the primary block 12a. In this case, the primary connections 10 lie within distinct vertical routing tracks, one for each port P of the primary block 12a.

Also, a secondary connection is placed to connect each port of each secondary block with the appropriate primary connection in a perpendicular manner (step 150 of FIG. 6). In the particular case of FIG. 3, the secondary connections 11 of the secondary blocks 12b and 12c connect the ports P of those blocks with the primary connections 10. The secondary connections 11 extend horizontally in this example, being substantially perpendicular to the vertical connections 10.

Generally speaking, horizontal routing tracks reside on a separate IC layer from vertical routing tracks in order to efficiently utilize all IC resources dedicated to routing of signals. As a result, the connections between horizontal and vertical routing tracks, as well as between routing tracks and the ports of the circuit blocks, are implemented by interlayer connections. A positive consequence of such an arrangement is that horizontal tracks cross over or under vertical tracks without unintended connection between the two. For example, referring to FIG. 3, the secondary connection 11 for Port 1 of the secondary block 12b, while being connected with the primary connection 10 for Port 1 of the primary block 12a, passes across all of the remaining primary connections 10 associated with the signal bus without making an electrical connection with them.

As a result of embodiments of this invention, the physical ordering of ports P of each primary and secondary block are not required to coincide. This phenomenon can be seen in FIG. 3, where the port ordering of the primary block 12a (2, n, 0, . . . , 1) differs from that of both the secondary blocks 12b (0, 2, n, . . . , 1) and 12c (n, 1, 0, . . . , 2). Therefore, IC designers are not bound to any particular port ordering scheme when designing circuit blocks.

Figure 1:
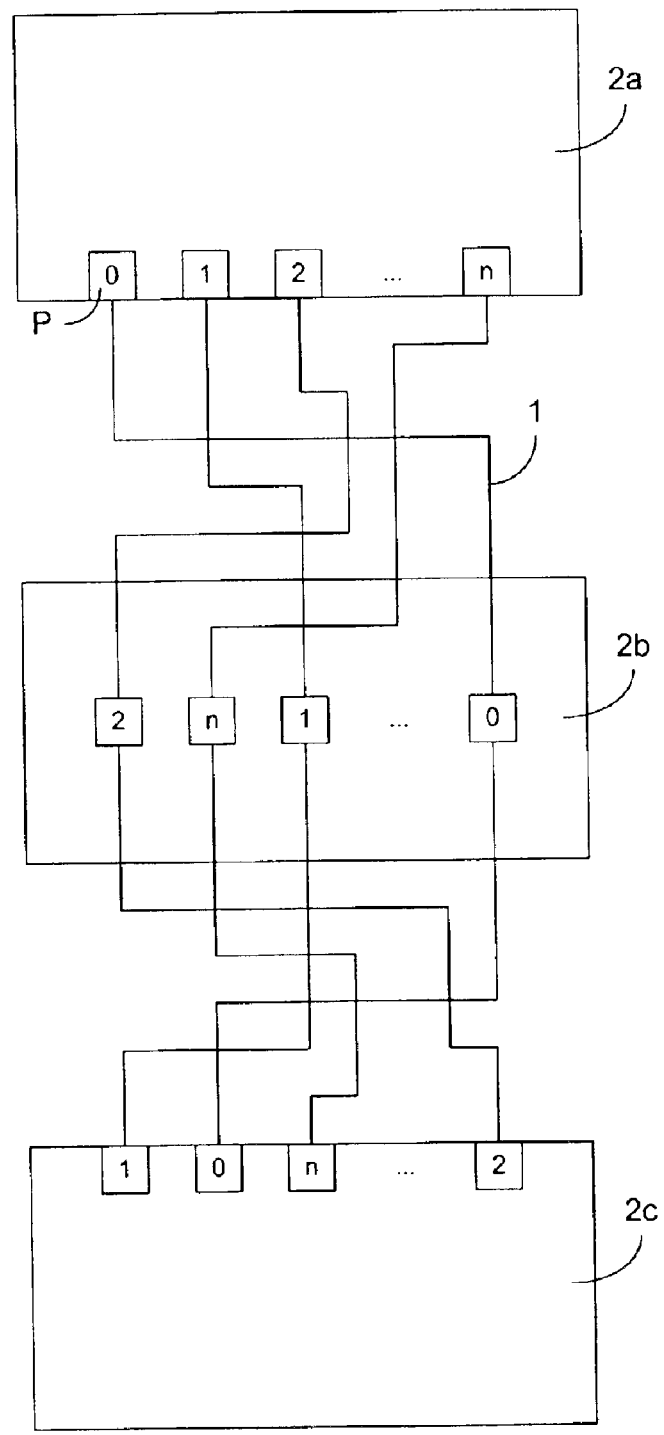
FIG. 1 is a diagram of an IC bus signal connection scheme from the prior art.
Figure 2:
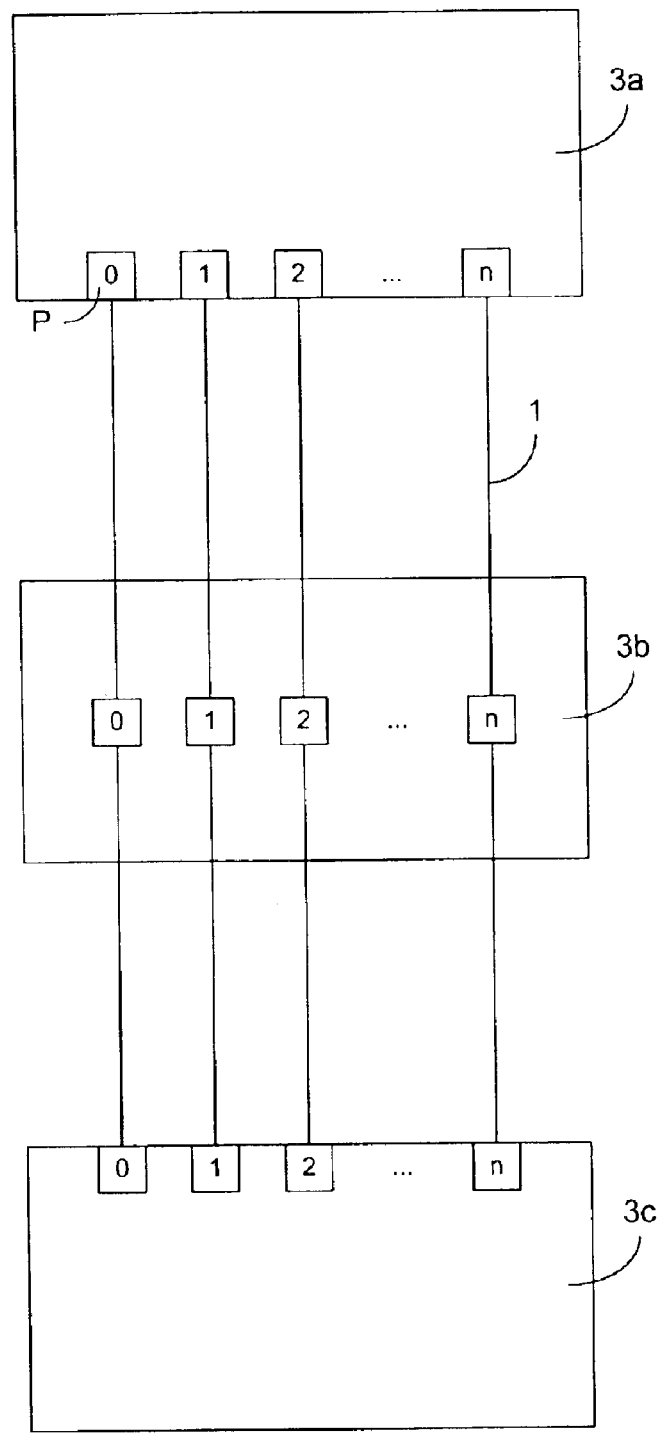
FIG. 2 is a diagram of an IC bus signal connection scheme from the prior art, wherein the block port placements of each block are forced to coincide.

Another advantage of embodiments of the invention is that substantially fewer routing resources are consumed when compared to the prior art, such as the signal bus routing shown in FIG. 1, in which a substantial number of horizontal routing tracks are implemented to achieve essentially the same result as that of FIG. 3. This reduction in routing resource consumption often results in easier "floorplanning," or physical placement of the various circuit blocks of an IC.

Figure 4:
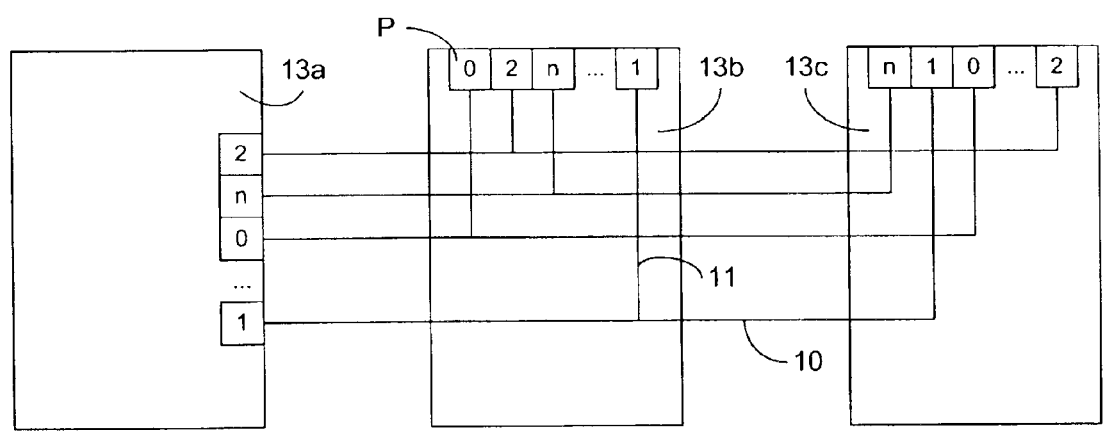
FIG. 4 is a diagram of an IC bus signal connection scheme according to an embodiment of the invention, wherein the circuit blocks and primary bus route are aligned horizontally.

The configuration and orientation of the primary bus route may vary greatly from case to case. As shown in the example of FIG. 4, the relative positioning of three circuit blocks 13 likely imply a horizontally-oriented primary bus route, unlike the vertically-oriented primary bus route of FIG. 3. Hence, in that case the primary connections 10 of the primary block 13a are horizontally oriented, while the secondary connections 11 of the secondary blocks 13b and 13c run vertically.

Figure 5:
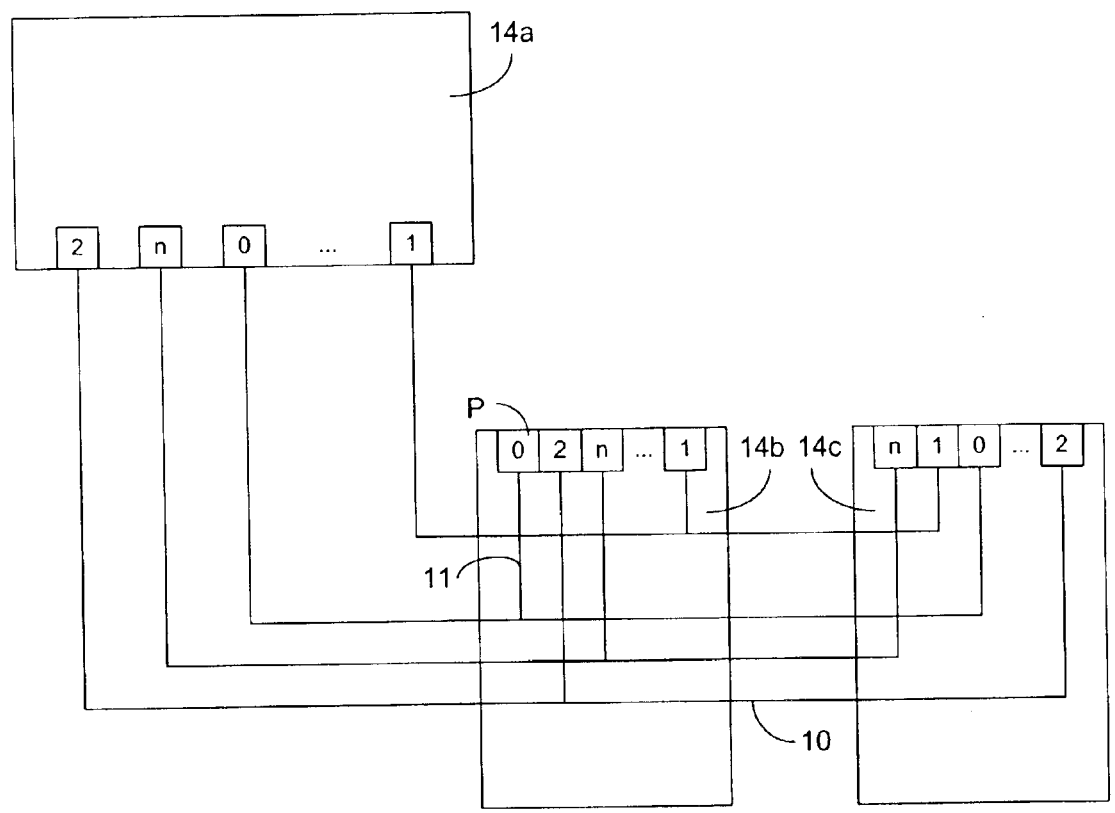
FIG. 5 is a diagram of an IC bus signal connection scheme according to an embodiment of the invention, wherein the circuit blocks are aligned so that the primary bus route runs both vertically and horizontally.

FIG. 5 displays a simplified case wherein the primary bus route is neither strictly horizontal or vertical, instead consisting of a combination thereof. Three circuit blocks 14 allow a primary bus route having both vertical and horizontal sections. In this case, block 14a is chosen as the primary block, with the primary connections 10 extending from the ports of that block. The secondary connections 11 in this example, associated with the secondary blocks 14b and 14c, are both vertically oriented to provide connection with the horizontal section of the primary connections 10. In other embodiments (not shown), the primary bus route may involve several direction changes, thus requiring the use of both horizontal and vertical routing tracks.

Additionally, unlike the embodiments of FIG. 3, FIG. 4, and FIG. 5, alternate embodiments may select a primary block that does not reside at the end of the primary bus route. However, selection of one of the blocks at the end of the primary bus route possesses the advantage of slightly reducing the end-to-end length of the signal bus. For example, block 12b of FIG. 3 could have been selected as the primary block, but that selection would have extended the signal bus from the bottom edge of block 12a to within the perimeter of that block.

Embodiments of the invention may also be described in terms of the IC signal bus structure resulting from the implementation of the above-described methods. In general, such signal bus structures include a set of primary connections, with each primary connection being connected to a separate port of a primary circuit block. Each primary connection lies essentially parallel to each other. Although the primary connections may all run in a single direction such as the vertical primary connections of FIG. 3 or the horizontal variety shown in FIG. 4, the primary connections may also change direction one or more times, such as in the example of FIG. 5. Connected to each of these primary connections are one or more secondary connections, each of which couples a port of a secondary block with one of the primary connections in a perpendicular fashion. This configuration ultimately results in the secondary connections of any particular secondary block to be parallel to each other. However, as indicated above, secondary connections of different secondary blocks may be oriented orthogonal to each other in the case that the primary connections do not simply describe a straight line.

From the foregoing, the invention provides integrated circuit bus structures, and improved methods for routing such structures, which allow relatively simple bus routing and efficient usage of limited IC routing resources without the need for strictly enforced port placement. Embodiments of the invention other than those shown above are also possible. As a result, the invention is not to be limited to the specific forms so described and illustrated; the invention is limited only by the claims.

What is claimed is:

1. A method for routing an integrated circuit signal bus, comprising:
   selecting a primary block from a plurality of blocks, each of the blocks having a plurality of ports to be connected to the signal bus, the remainder of the plurality of blocks being secondary blocks;

positioning the plurality of ports of the primary block so that no two ports of the primary block reside with a single routing track running parallel to the portion of a primary bus route residing closest to the primary block;

positioning the plurality of ports of each secondary block so that no two ports within each secondary block reside within a single routing track running perpendicular to the portion of the primary bus route residing closest to that secondary block;

for each port of the primary block, placing a primary connection over that port parallel to the primary bus route, each primary connection running substantially the length of the primary bus route; and for each port of each secondary block, placing a secondary connection extending orthogonally from one of the primary connections to that port.

2. The method of claim 1, wherein the primary bus route essentially describes a straight line.

3. The method of claim 1, wherein the primary bus route contains at least one change of direction.

4. A computer system for routing an integrated circuit signal bus, comprising:

means for selecting a primary block from a plurality of blocks, each of the blocks having a plurality of ports to be connected to the signal bus, the remainder of the plurality of blocks being secondary blocks;

means for positioning the plurality of ports of the primary block so that no two ports of the primary block reside with a single routing track running parallel to the portion of a primary bus route residing closest to the primary block;

means for positioning the plurality of ports of each secondary block so that no two ports within each secondary block reside within a single routing track running perpendicular to the portion of the primary bus route residing closest to that secondary block;

for each port of the primary block, means for placing a primary connection over that port parallel to the primary bus route, each primary connection running substantially the length of the primary bus route; and for each port of each secondary block, means for placing a secondary connection extending orthogonally from one of the primary connections to that port.

5. The computer system of claim 4, wherein the primary bus route essentially describes a straight line.

6. The computer system of claim 4, wherein the primary bus route contains at least one change of direction.

7. A program storage medium readable by a computer system, embodying a program executable by the computer system to perform method steps for routing an integrated circuit signal bus, the method steps comprising:

selecting a primary block from a plurality of blocks, each of the blocks having a plurality of ports to be connected to the signal bus, the remainder of the plurality of blocks being secondary blocks;

positioning the plurality of ports of the primary block so that no two ports of the primary block reside with a single routing track running parallel to the portion of a primary bus route residing closest to the primary block;

positioning the plurality of ports of each secondary block so that no two ports within each secondary block reside within a single routing track running perpendicular to the portion of the primary bus route residing closest to that secondary block;

for each port of the primary block, placing a primary connection over that port parallel to the primary bus route, each primary connection running substantially the length of the primary bus route; and for each port of each secondary block, placing a secondary connection extending orthogonally from one of the primary connections to that port.

8. The program storage medium of claim 7, wherein the primary bus route essentially describes a straight line.

9. The program storage medium of claim 7, wherein the primary bus route contains at least one change of direction.

* * * * *